(12) United States Patent
Takeda

(10) Patent No.: US 8,466,565 B2
(45) Date of Patent: Jun. 18, 2013

(54) SUBSTRATE AND SEMICONDUCTOR DEVICE

(75) Inventor: Hiromitsu Takeda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 213 days.

(21) Appl. No.: 12/729,548

(22) Filed: Mar. 23, 2010

(65) Prior Publication Data

US 2010/0258953 A1    Oct. 14, 2010

(30) Foreign Application Priority Data

Apr. 9, 2009    (JP) .................................. 2009-095298

(51) Int. Cl.
*H01L 23/48*    (2006.01)
*H01L 23/52*    (2006.01)
*H01L 29/40*    (2006.01)
*H01L 31/00*    (2006.01)
*H01L 21/44*    (2006.01)

(52) U.S. Cl.
USPC ............................ 257/782; 257/459; 438/613

(58) Field of Classification Search
USPC ........................................................ 257/782
See application file for complete search history.

(56) References Cited

U.S. PATENT DOCUMENTS

| 2004/0166660 A1* | 8/2004 | Yamaguchi ................... 438/613 |
| 2006/0060959 A1* | 3/2006 | Hayashi et al. ................ 257/697 |
| 2009/0218652 A1* | 9/2009 | Moriya et al. ................. 257/459 |

FOREIGN PATENT DOCUMENTS

| JP | 2005-051240 | 2/2005 |
| JP | 2007-005452 | 1/2007 |

* cited by examiner

*Primary Examiner* — Fernando L Toledo
*Assistant Examiner* — Valerie N Newton
(74) *Attorney, Agent, or Firm* — Young & Thompson

(57) ABSTRACT

A substrate has a plurality of pads formed over one surface of a base, and an insulating film which is formed thereon and has a plurality of openings formed therein so as to expose each of the pads, wherein the openings of the insulating film are formed so that, in each pad formed at the corner of the base, among the plurality of pads, a first peripheral portion which composes a portion of the pad more closer to the corner and more distant away from the center of the base is covered by the insulating film, and so that a second peripheral portion which composes a portion of the pad more closer to the center as compared with the first peripheral portion is exposed in the opening.

16 Claims, 11 Drawing Sheets

SUBSTRATE AND SEMICONDUCTOR DEVICE

This application is based on Japanese patent application No. 2009-095298, the content of which is incorporated hereinto by reference.

BACKGROUND

1. Technical Field

The present invention relates to a substrate and a semiconductor device.

2. Related Art

A semiconductor element and an external electronic circuit substrate such as a mother board are connected generally as described below. First, the semiconductor element is mounted on an interposer such as printed substrate, and the product is then made up to a package in a form of LGA (land grid array) having flat electrode pads arranged on one surface of the interposer, BGA (ball grid array) further having solder balls disposed on the similar flat electrode pads, or the like. The package is then electrically connected to the external electronic circuit substrate such as the mother board, while placing a solder paste in between.

The flat electrode pad herein is configured by a portion of an interconnect pattern formed on one surface of the interposer, and exposed out from an opening of a solder resist layer formed further on the interconnect pattern. The configurations herein may be classified into those of solder mask defined (SMD) type in which each opening of the solder resist layer is smaller than each pad, so that the geometry of exposed area is defined by the solder resist layer; and those of non-solder mask defined (NSMD) type in which each opening of the solder resist layer is larger than each pad.

Japanese Laid-Open Patent Publication No. 2005-051240 describes a semiconductor device which adopts a solder ball land structure in which the SMD structure and the NSMD structure are combined. In a plurality of solder ball lands described in this document, a first peripheral portion of each land having the SMD structure is directed towards the center of the surface for mounting the solder balls, whereas a second peripheral portion of each land having the NSMD structure is reversely directed away from the center of the surface for mounting the solder balls. By virtue of the configuration, adhesion between the solder balls and the surface for mounting the same is reportedly more tightened, even if the surface for mounting the solder balls typically in a BGA semiconductor package should warp.

Japanese Laid-Open Patent Publication No. 2007-005452 describes a semiconductor device having an external connection terminal portion where the lands (pads) of a semiconductor package (semiconductor device) are connected to external connection terminals. In the external connection terminal portion, corner portions of each land are configured to have the SMD structure in which the surface of the land and the inner circumferential edge of each opening of an insulating film are brought into contact, and the middle portion of the outer edge of each land positioned between every adjacent pair of the corner portions are configured to have the NSMD structure in which a gap is formed between the outer edge of the land and the inner circumferential edge of each opening of the insulating film. In this configuration, a land extraction interconnect is formed at one corner of the land covered with the insulating film, and the SMD-structured portions and the NSMD-structured portions are alternately disposed at three or more positions.

By virtue of this configuration, the substrate interconnect extended from the land is reportedly prevented from being disconnected due to thermal stress ascribable to difference in thermal expansion coefficient between the semiconductor package and the mounting substrate (electronic circuit substrate).

SUMMARY

By the way, the pads are configured typically using a metal material such as copper, the surfaces of which are plated with a metal typically by nickel-gold plating. Also in the BGA and LGA packages, the pads are connected to the terminals on the electronic circuit substrate while placing the solder material in between. In this case, the NSMD type structure is more advantageous in view of improving the adhesiveness between the pads and the solder.

Further explanations will be given referring to FIG. 10. FIG. 10 is a sectional view illustrating a state of bonding of a substrate 10 having an NSMD-structured pad 14 formed on one surface of a base 30 of an interposer, with an electronic circuit substrate 40. On one surface of the base 30, the pad 14 and a solder resist layer 20 are formed. For the case where such NSMD-structured pad 14 of the thus-configured substrate 10 is bonded to a terminal 42 of the electronic circuit substrate 40 while placing a solder material 50 in between, the solder material 50 comes into contact also with the corner portions of the pad 14 (portions circled by broken lines in the drawing). As a consequence, the pad 14 and the solder material 50 are bonded over a large area, and thereby the adhesiveness between the pad 14 and the solder material 50 may supposedly be improved. It is, therefore, preferable for the pad to adopt the NSMD structure under general environment of use, in view of improving the adhesiveness between the solder and the pad.

On the other hand, the present inventors found out that the NSMD-structured pad may cause separation from the base, under a severe environment of use which is more likely to cause strong impact typically by dropping. The present inventors extensively investigated into a mechanism of separation between the pad and the base, under such severe environment of use. It was made clear, that the NSMD-structured pad, aimed at improving the adhesiveness with respect to the solder, may concentrate stress at the interface between the pad and the base, if exposed to a large impact typically caused by dropping. A mode of stress concentration is illustrated by wavy lines in FIG. 11. For the case where the NSMD structure is adopted, the stress caused by impact may be concentrated at the interface of the pad 14, as combined with the solder material 50, with respect to the base 30 which composes the substrate 10, at the edges of the pads, which is enough to cause the separation. It was also made clear that this sort of stress is strongly applied particularly to the corners of the substrate, and that the separation between the pad and the base is therefore more likely to cause at the pads arranged at the corner portions of the base 30.

The prior arts described in Japanese Laid-Open Patent Publication Nos. 2005-051240 and 2007-005452 relate to configuration capable of preventing the adhesiveness from degrading, due to warping ascribable to difference in the thermal expansion coefficient between the package and the mother board. The conventional configurations have, however, been incapable of effectively prevent the separation between the pad and the base, under a severe environment of use which is different from the general one where a strong impact typically due to dropping may occur.

According to the present invention, there is provided a substrate which includes:

a base;

a plurality of pads which are formed over one surface of the base; and an insulating film which is formed over the plurality of pads formed over one surface of the base, and has a plurality of openings formed therein so as to at least partially expose each of the pads, the plurality of openings of the insulating film being formed so that, at each pad formed at the corner of the base, among the plurality of pads, a first peripheral portion which composes a portion of the pad positioned more closer to the corner and more distant away from the center of the base is covered by the insulating film, and so that a second peripheral portion which composes a portion of the pad positioned more closer to the center of the base, as compared with the first peripheral portion, is exposed in the opening.

According to the present invention, there is also provided a semiconductor device which includes the above-described substrate, and a semiconductor element mounted over one surface of the substrate.

According to these configurations, each pad formed at the corner of the base may be configured to have the SMD structure in which the first peripheral portion thereof positioned more closer to the corner is covered with the insulating film, so that, as described later referring to FIG. 9, any large stress induced by impact may be applied in a distributed manner over a plurality of positions. Accordingly, the pads and the base may be prevented from separating from each other, even under a strong impact. Also since the first peripheral portion is covered with the insulating film at a portion of the pad on the corner side thereof, again the separation under a strong impact may be avoidable. In addition, each pad formed at the corner of the base may also be configured to have the NSMD structure in which the second peripheral portion thereof positioned more closer to the center of the base, as compared with the first peripheral portion, is exposed in the opening. Accordingly, the adhesiveness between the pads and the solder material may be improved also under general environment of use.

Note that also arbitrary combinations of the above-described constituents, and expressions of the present invention exchanged among the method, device and so forth, are valid as embodiments of the present invention.

According to the present invention, on the substrate which includes the pads and the insulating film having openings which at least partially expose the pads therein, which are formed over one surface of the base, the adhesiveness between the pads and the solder material under general environment of use may be improved, and the pads and the base may be prevented from separating from each other even under a strong impact.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
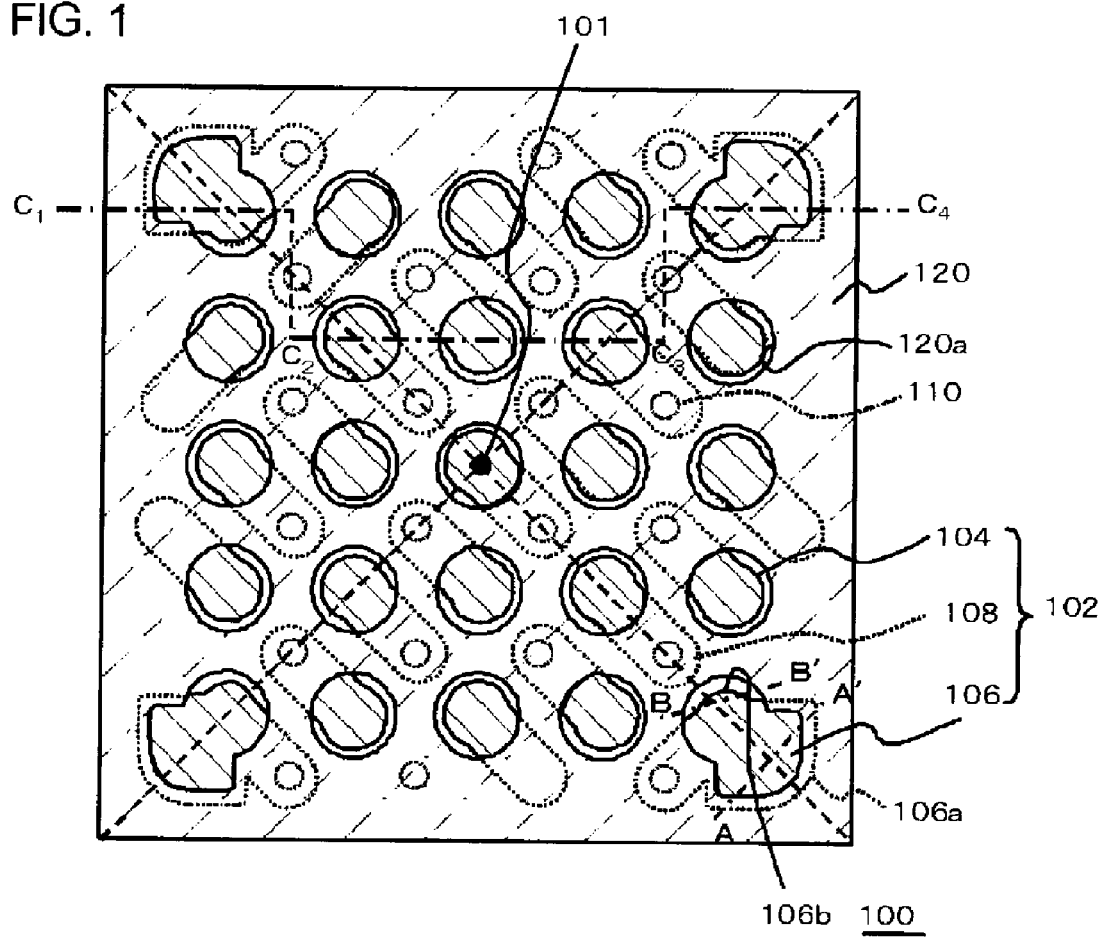
FIG. 1 is a plan view illustrating an exemplary configuration embodied on one surface side of a substrate in one embodiment of the present invention.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that whatever similar constituents in all drawings will be given similar reference numerals or symbols, and relevant explanations will not be repeated.

Figure 2A:
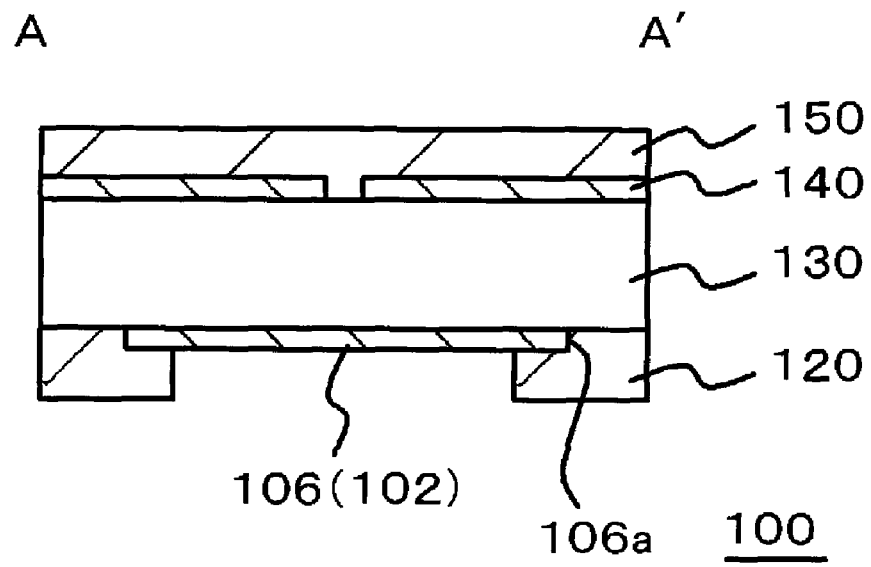
FIGS. 2A and 2B are sectional views of the substrate illustrated in FIG. 1, respectively taken along line A-A' and line B-B'.

FIG. 1 is a plan view illustrating an exemplary configuration embodied on one surface of a substrate in one embodiment of the present invention. FIG. 2A is a sectional view taken along line A-A' in FIG. 1, and FIG. 2B is a sectional view taken along line B-B' in FIG. 1.

Figure 2B:
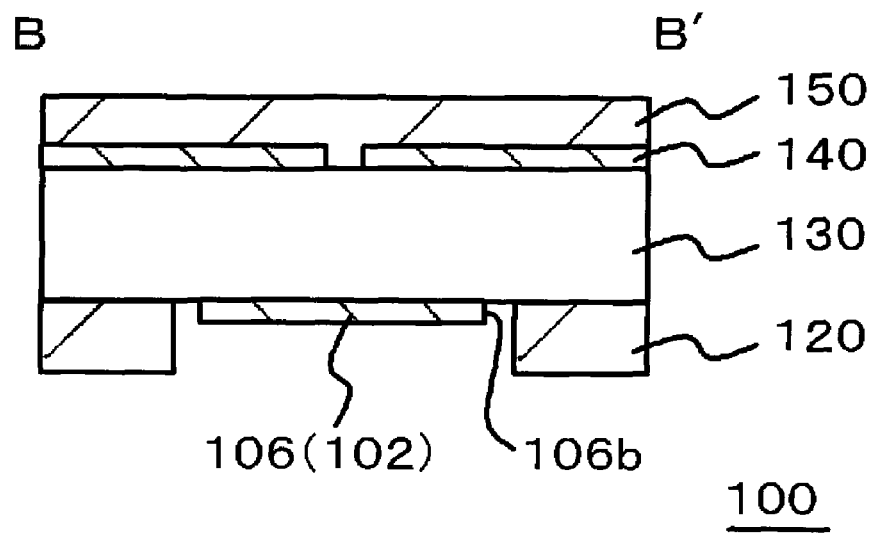

As illustrated in FIGS. 2A and 2B, a substrate 100 includes a base 130, an interconnect pattern 102 and a solder resist layer 120 (insulating film) formed on one surface (the lower surface in the drawing, representing an external electrode structure) of the base 130, and an interconnect pattern 140 and solder resist layer 150 (insulating film) formed on the other surface of the substrate 130 opposite to one surface (the top surface in the drawing).

The base 130 may be configured, for example, to have a stacked structure in which interconnect layers and resin layers (insulating layers) are alternately stacked. The base 130 has a plurality of vias 110 provided thereto, through which the interconnects in different levels are electrically connected. Each via 110 may be formed between the interconnects of different levels, or may be extended through the base 130 from the interconnect patterns formed on one surface to the opposite other surface of the base 130. The substrate 100 may be a printed interconnect board such as multi-layered interconnect substrate, or may be an interposer.

The interconnect pattern 102 includes a plurality of pads 104, a plurality of pads 106, and a plurality of interconnects 108. In this embodiment, the pads 104 and the pads 106 may be flat electrode pads of an LGA (land grid array) package. Each interconnect 108 is formed so as to be extended respectively from each pad 104 or pad 106, and is connected to the via provided in the base 130. Although not illustrated, there may be some pads (interconnects 108) not connected to the vias 110. In this embodiment, the plurality of pads 104 and pads 106 are arranged to form a five-column-five-row matrix. The pads 106, among the plurality of pads, are formed at the corners of the base 130. In this embodiment, the pads 106 formed at the corners of the base 130 have a pattern different from that of the other pads 104.

The solder resist layer 120 is formed over the interconnect pattern 102. The solder resist layer 120 is formed almost over the entire range of one surface of the base 130. The solder resist layer 120 has a plurality of openings 120a which allow the individual pads 104 and the pads 106 to expose therein.

In this embodiment, the openings 120a of the solder resist layer 120 are formed so that, in each pad 106 formed at the corner of the base 130, among the plurality of pads 104 and 106, a first peripheral portion 106a which composes a portion of the pad 106 positioned more closer to the corner and more distant away from the center 101 of the base 130 is covered by the solder resist layer 120, and so that a second peripheral portion 106b which composes a portion of the pad 106 positioned more closer to the center 101 of the base 130, as compared with the first peripheral portion 106a, is exposed in the opening 102a. In other words, the pad 106 in this embodiment is configured to have the SMD (solder-mask defined) structure at the first peripheral portion 106a thereof, and to have the NSMD (non-solder-mask defined) structure at the second peripheral portion 106b thereof. FIG. 2A is a sectional view of the pad 106 taken at the first peripheral portion 106a, and FIG. 2B is a sectional view of the pad 106 taken at the second peripheral portion 106b.

On the other hand, in this embodiment, the openings 120a of the solder resist layer 120 are formed so as to expose therein the entire peripheral portion, except a portion brought into contact with correspondent one of the interconnects 108, of at least one pad 104 other than the pads 106 formed at the corners of the base 130, among the plurality of pads 104 and 106. In the configuration illustrated in FIG. 1, each pad 104, other than the pads 106 formed at the corners of the base 130, is formed to have the NSMD structure in which the peripheral portion of the pad 104, other than the portion thereof brought into contact with the correspondent interconnect 108, is exposed in the opening 120a.

In this embodiment, each pad 106 formed at the corner of the base 130 has a plane geometry different from that of the pad 104. The pad 106 has a geometry which contains a reinforcing pattern formed in a portion thereof more closer to the corner and more distant away from the center 101 of the base 130. The first peripheral portion 106a is formed in the reinforcing pattern.

Figure 3:
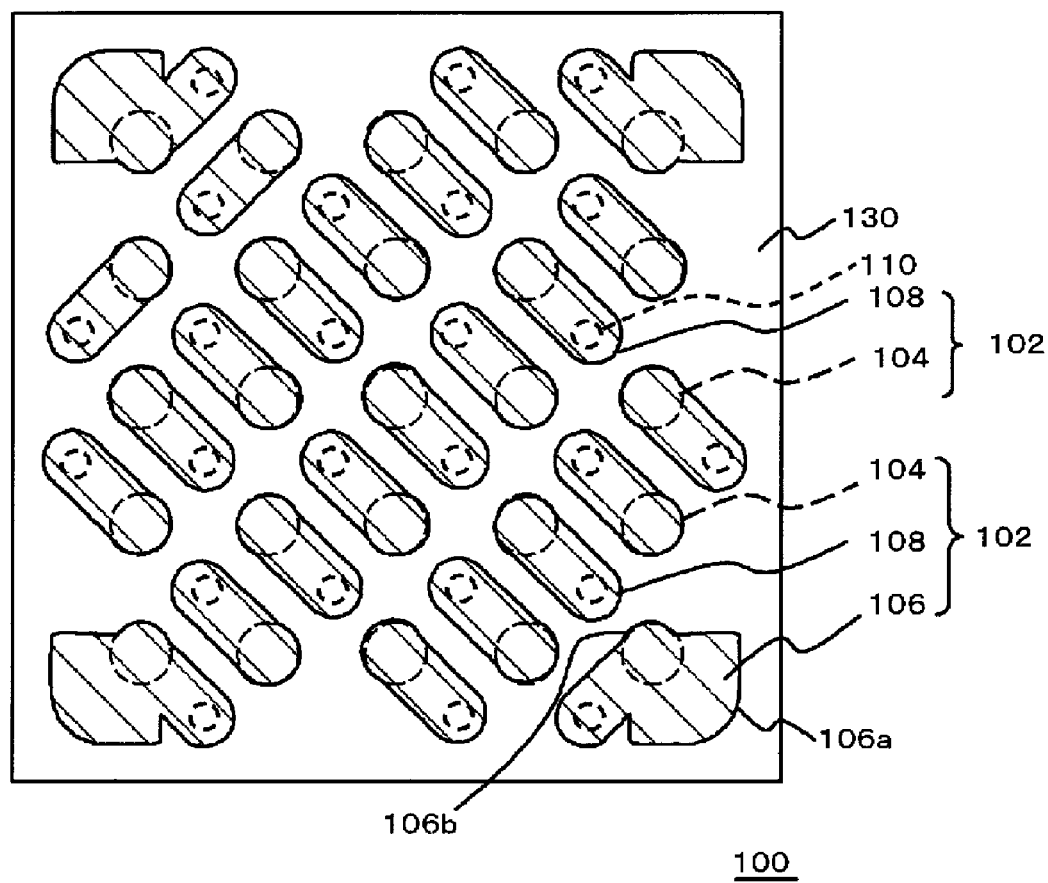
FIG. 3 is a plan view illustrating a geometry of an interconnect pattern formed on one surface of the substrate illustrated in FIG. 1.
Figure 4A:
FIGS. 4A to 4C are drawings explaining geometries of the pads.
Figure 4B:
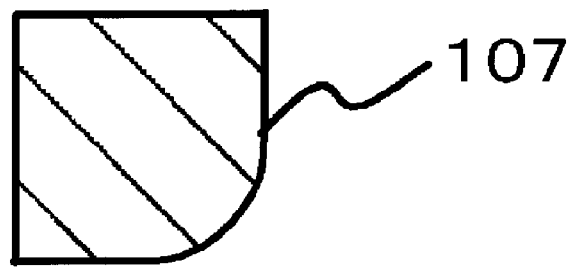
Figure 4C:
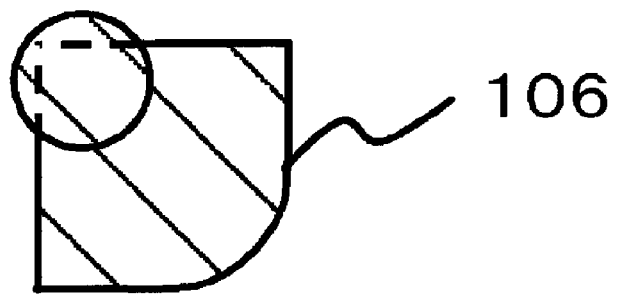

FIG. 3 is a plan view illustrating a geometry of the interconnect pattern 102 formed on one surface of the substrate 100. FIGS. 4A to 4C are drawings explaining geometries of the pads.

FIG. 4A is a drawing illustrating a plane geometry of the pad 104. As illustrated herein, the pad 104 may be formed to have, for example, a circular geometry. The pad 106 may be formed to have a geometry which is configured by a pattern similar to that illustrated in FIG. 4A and a reinforcing pattern added to the outer circumferential side thereof. FIG. 4B is a plan view illustrating a plane geometry of the reinforcing pattern 107 added to the pad 106. The reinforcing pattern 107 herein has a nearly rectangular geometry, with one corner, positioned at the corner side of the base 130, thereof chamfered to give an arch profile. By providing this sort of reinforcing pattern 107, the area of contact between the pad 106 and the base 130 may be increased, and thereby separation of the pads 106 at the corners of the base 130 may be reduced. In addition, by forming the reinforcing pattern 107 so as to be chamfered at one corner thereof on the corner side of the base 130 to give the arch profile, stress possibly concentrated at the corners of the base 130 may be moderated. FIG. 4C is a drawing illustrating a plane geometry of the pad 106. The pad 106 herein has a geometry which is configured by a pattern similar to that of the pad 104 and a reinforcing pattern 107 partially overlapped with each other. The geometries of the pad 104, the reinforcing pattern 107, and the pad 106 are not limited to those illustrated in the drawings, but may be modified in various ways.

Figure 5:
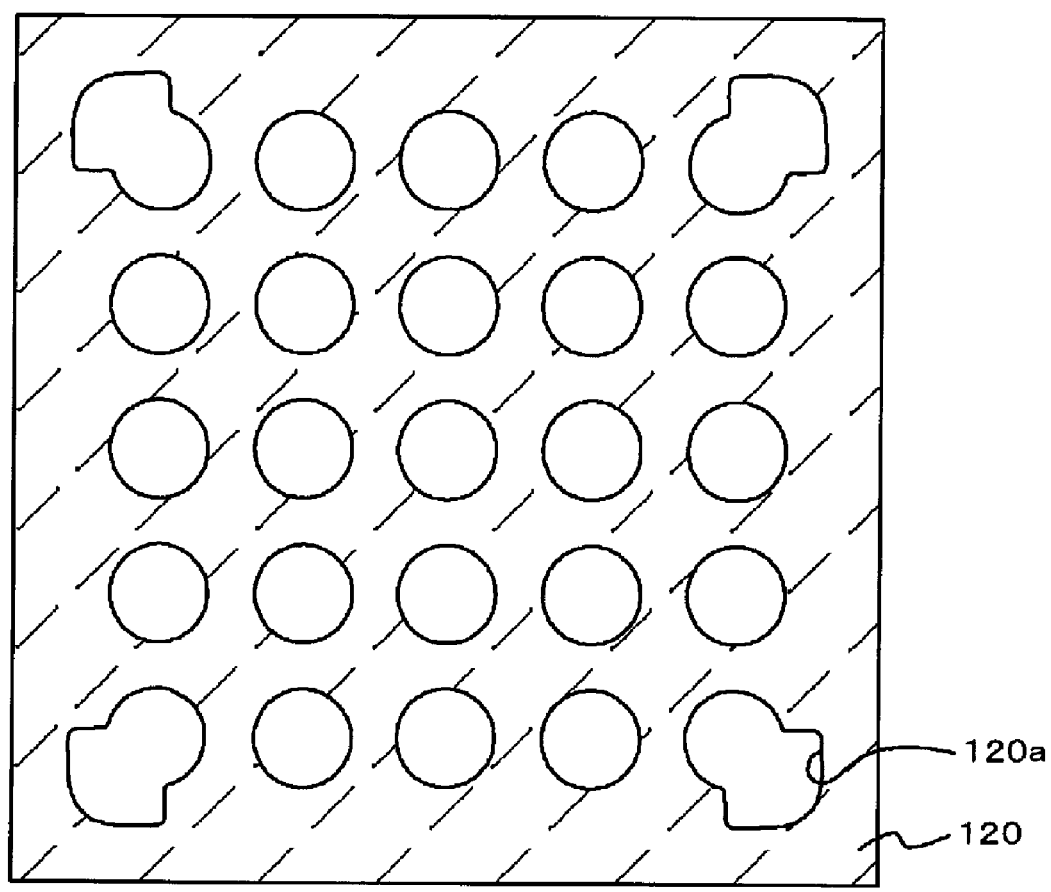
FIG. 5 is a drawing illustrating a geometry of the solder resist layer formed on one surface of the substrate illustrated in FIG. 1.

FIG. 5 is a plan view illustrating a geometry of the solder resist layer 120 formed over one surface of the substrate 100.

In this embodiment, the interconnect pattern 102 having the pattern illustrated in FIG. 3 is formed over one surface of the base 130, and the solder resist layer 120 having the pattern illustrated in FIG. 5 is formed further thereon. The solder resist layer 120 has a plurality of openings 120a formed therein, so as to at least partially expose the individual pads 104 and the pads 106.

Figure 6:
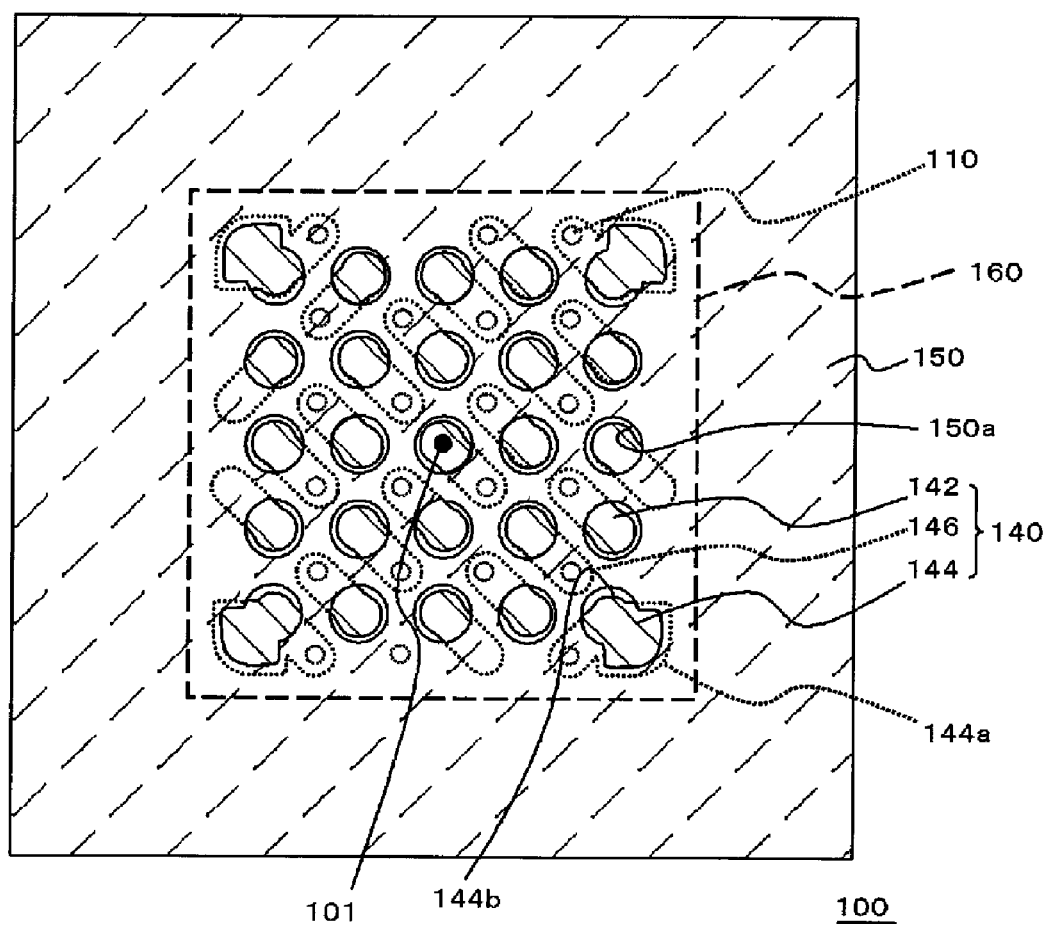
FIG. 6 is a plan view illustrating an exemplary configuration embodied on the other surface side of the substrate in one embodiment of the present invention.

FIG. 6 is a plan view illustrating an exemplary configuration on the other surface side of base 130 of the substrate 100.

Figure 7A:
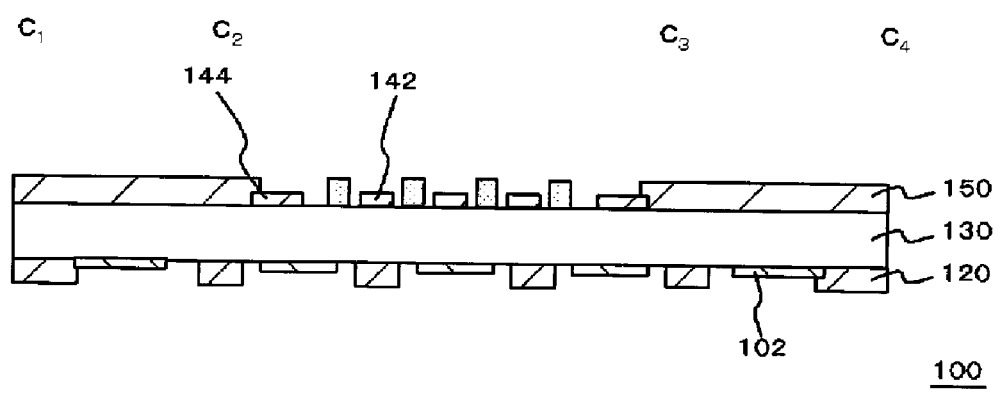
FIGS. 7A and 7B are sectional views illustrating a configuration of a semiconductor device having a semiconductor element mounted on the substrate.
Figure 7B:
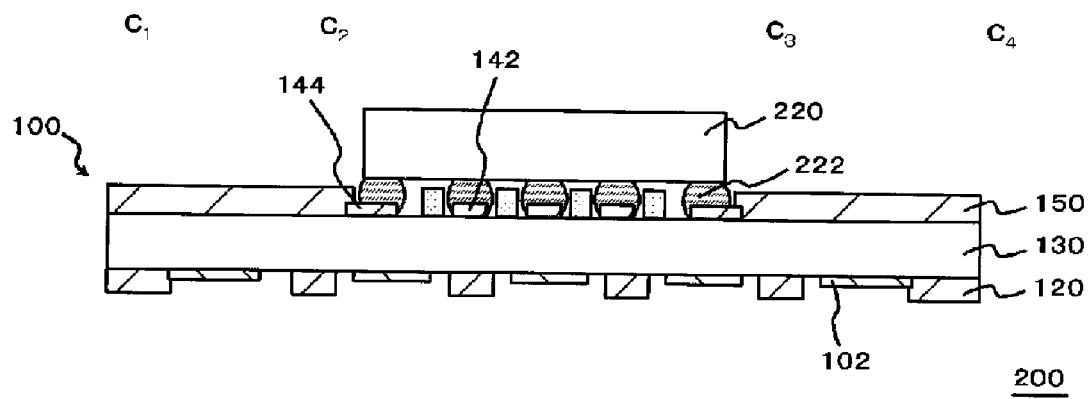

In this embodiment, a semiconductor element 220, which will be explained with referring to FIGS. 7A and 7B, is mounted on the other surface side of the substrate 100. In the illustrated example, the semiconductor element 220 is mounted on the other surface of the base 130 by flip-chip bonding. The interconnect pattern 140 contains a plurality of pads 142, a plurality of pads 144, and a plurality of interconnects 146, all of which are formed in a device placement area 160 which represents an area of the substrate 100 in which the semiconductor element 220 is placed. The pads 142 and the pads 144 are formed at positions respectively corresponded to a plurality of terminals (not illustrated) formed over the device forming surface of the semiconductor element 220. The pads 142 and the pads 144 are bonded to the correspondent terminals of the semiconductor element 220 by flip-chip bonding, while placing solder balls 222 in between. The interconnects 146 are formed so as to be extended respectively from the pads 142 or the pads 144, and are connected to the vias 110 provided in the base 130. Although not illustrated, there may be some pads (interconnects 146) not connected to the vias 110.

The interconnect pattern 140 exemplified herein, configured similarly to that of the interconnect pattern 102 illustrated in FIG. 1, may alternatively be modified to have various configurations. The plurality of pads 142 and the pads 144 are arranged to form a matrix. The pads 144, among the plurality of pads, are formed at the corners of the device placement area 160 (or corners of the base 130 in other words). In this embodiment, the pads 144 formed at the corners of the device placement area 160 have a pattern different from that of the other pads 142. The pads 144 formed at the corners of the device placement area 160 may be configured to have a plane geometry, in which a reinforcing pattern is added to the pad 142, similarly to as explained with respect to the pads 106 referring to FIGS. 4A to 4C. The pads 142 and the pads 144 are respectively have the same structure as the pads 104 and the pads 106.

The solder resist layer 150 is formed over the interconnect pattern 140. The solder resist layer 150 has a plurality of openings 150a which allow the individual pads 142 and the pads 144 to expose therein. The pattern of the openings 150a of the solder resist layer 150 may be similar to that of the openings 120a of the solder resist layer 120.

In this embodiment, the openings 150a of the solder resist layer 150 are formed so that, in each pad 144 formed at the corner of the base 130, among the plurality of pads 142 and 144, a first peripheral portion 144a which composes a portion of the pad 144 positioned more closer to the corner and more distant away from the center 101 of the base 130 is covered by the solder resist layer 150, and so that a second peripheral portion 144b which composes a portion of the pad 144 positioned more closer to the center 101 of the base 130 as compared with the first peripheral portion 144a is exposed in the opening 150a. In other words, the pad 144 in this embodiment is configured to have the SMD (solder-mask defined) structure at the first peripheral portion 144a thereof, and to have the NSMD (non-solder-mask defined) structure at the second peripheral portion 144b thereof.

FIGS. 7A and 7B are sectional views of the thus-configured substrate 100. FIG. 7A is a sectional view taken along line $C_1$-$C_2$-$C_3$-$C_4$ in FIG. 1.

FIG. 7B is a sectional view illustrating a configuration of a semiconductor device 200 having a semiconductor element 220 mounted on the substrate 100. The configuration of the substrate 100 illustrated in FIG. 7B again corresponds to that seen in the section taken along line $C_1$-$C_2$-$C_3$-$C_4$ in FIG. 1. The semiconductor element 220 is connected to the pads 142 and the pads 144 of the substrate 100, while placing the solder balls 222 in between. An under-fill resin (not illustrated) may be filled and cured between the semiconductor element 220 and the substrate 100. The semiconductor element 220, explained in this embodiment referring to the case of flip-chip bonding, may alternatively be bonded to the substrate 100 by wire bonding or still other methods. Resin encapsulation may be accomplished by transfer molding.

Figure 8:
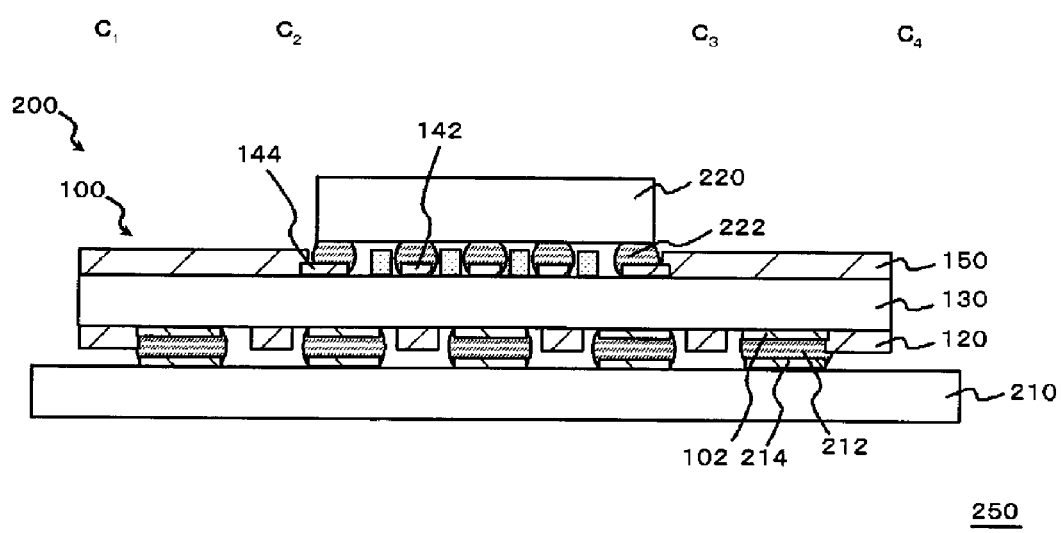
FIG. 8 is a sectional view illustrating a configuration of a semiconductor device chip having a semiconductor device mounted on an electronic circuit substrate.

FIG. 8 is a sectional view illustrating a configuration of a semiconductor device chip 250 having the semiconductor device 200 mounted over the electronic circuit substrate 210. The semiconductor device 200 is connected to the pads 214 of the electronic circuit substrate 210 while placing a solder material 212 in between. The semiconductor device chip 250 may be obtained by the procedures below. First, the solder material 212 such as a solder paste is preliminarily applied over the pads 214 on one surface of the electronic circuit substrate 210. Next, the semiconductor device 200 is mounted on the electronic circuit substrate 210, while aligning the pads 214 on one surface of the electronic circuit substrate 210 with the pad-arranged surface of the semiconductor device 200 (one surface of the substrate 100 having the interconnect pattern 102 and the solder resist layer 120 formed thereon). The paste is then fused under heating, to thereby bond the pads 104 and the pads 106 of the semiconductor device 200 with the pads 214 of the electronic circuit substrate 210. The solder material, supplied herein to the electronic circuit substrate 210 in a form of solder paste, may alternatively be supplied by solder coating. The solder paste may be applied typically by screen printing, or dispensing. The electronic circuit substrate 210 may be a mother board, a main board or the like. An under-fill resin (not illustrated) may be filled and cured between the semiconductor device 200 and the electronic circuit substrate 210.

Next, effects of the substrate 100 and the semiconductor device 200 in this embodiment will be explained.

By virtue of the above-described configuration, the pads 106 and the pads 144 formed at the corners of the base 130 may be configured to have the SMD structure in which the first peripheral portions thereof positioned more closer to the corners are covered with the insulating films. Accordingly, any stress induced by impact may be applied in a distributed manner at a plurality of positions, and thereby the pads and the base may be prevented from separating from each other.

Figure 9:
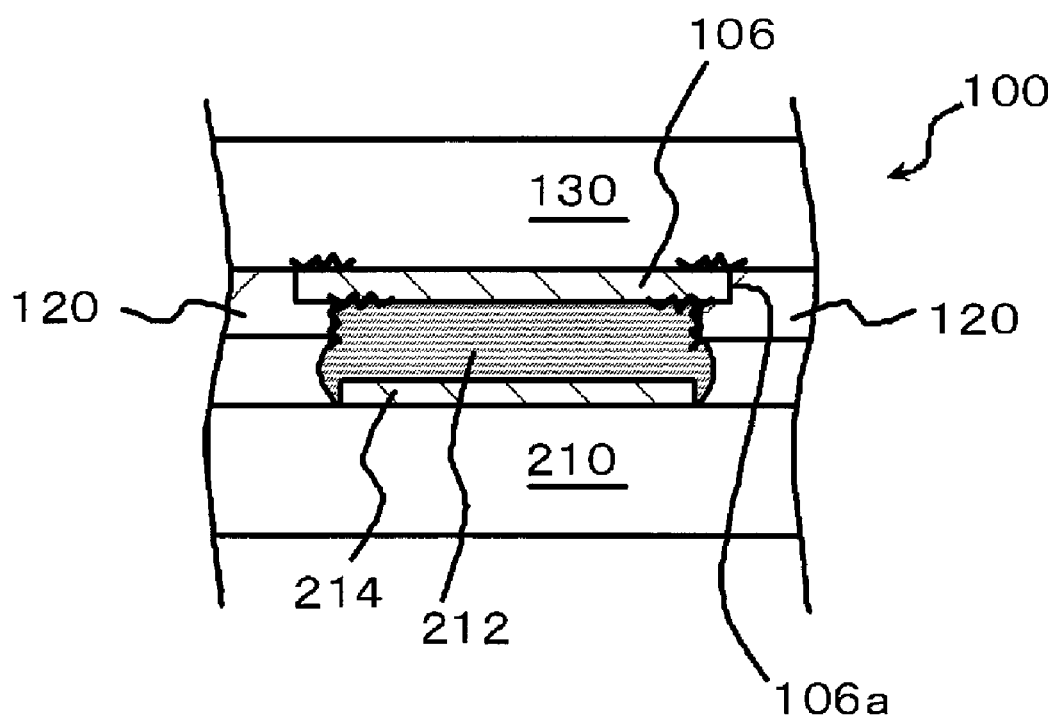
FIG. 9 is a drawing explaining an effect of the substrate of one embodiment of the present invention.

Further explanation will be given below referring to FIG. 9. The explanation herein deals with an exemplary case of the pads 106, but the same will apply also to the pads 144. As indicated by wavy lines in FIG. 9, by adopting the SMD structure at the corners of the base 130, in which the first peripheral portions 106a are covered by the solder resist layer 120, any stress induced by a large impact typically caused by dropping may be applied in a distributed manner, not only to the interface between the pads 106 and the base 130 at the edges of the pads 106, but also to the interface of the solder material 212 with the pads 106, or with the solder resist layer 120. Accordingly, the pads 106 and the base 130 may be prevented from separating from each other.

Also since the first peripheral portion 106a is covered with the insulating film at a portion of the pad on the corner side thereof, again the separation between the pads 106 and the base 130 under a strong impact may be avoidable. In addition, each pad formed at the corner of the base may also be configured to have the NSMD structure in which the second peripheral portion 106b thereof, positioned more closer to the center of the base as compared with the first peripheral portion 106a, is exposed in the opening. Accordingly, the adhesiveness between the pads 106 and the solder material 212 may be improved also under general environment of use.

Figure 10:
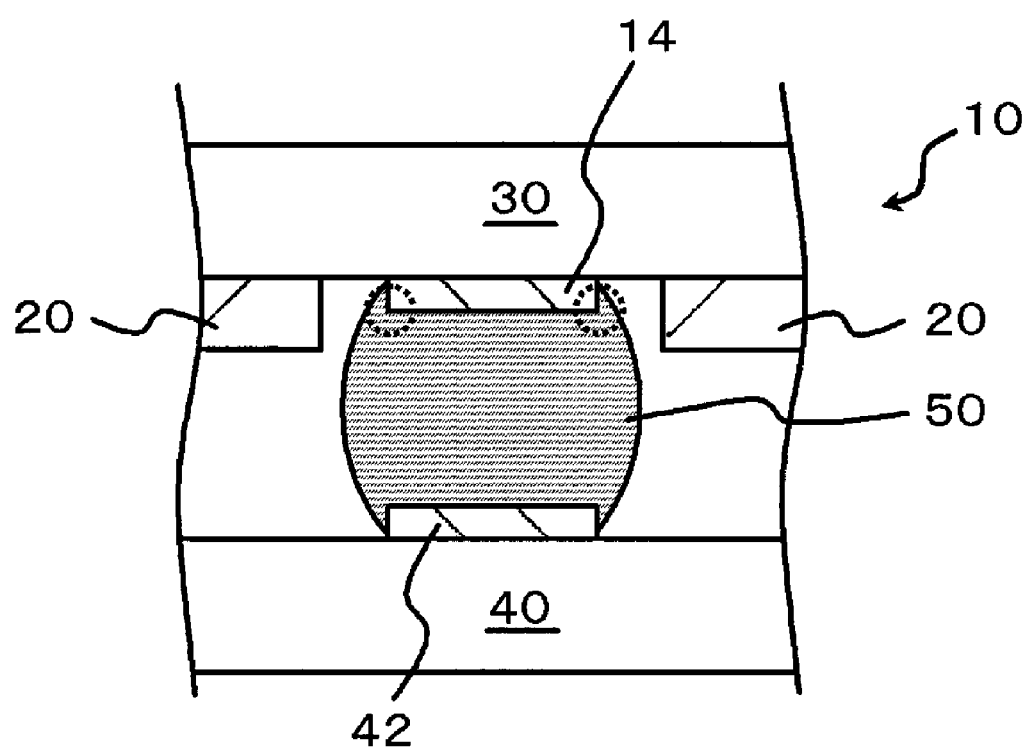
FIG. 10 and FIG. 11 are drawings explaining problems in the related arts.

In particular, in an external electrode structure of the semiconductaor device 200 on one surface side of the base 130 of the substrate 100, the pads configured by flat electrode pads of an LGA package may have a smaller amount of solder material brought into contact with the surface thereof, as compared with a BGA package. The LGA package may, therefore, be degraded in temperature resistance, as compared with the BGA package. The degradation of temperature resistance may be ascribable to stress-induced cracks in the solder, at around the interface between the pads 14 and the solder material 50, as indicated by broken-line circles in FIG. 10. Now by adopting the NSMD structure to the pads, the pads 14 are bonded with the solder material 50 also at the side faces thereof, and thereby the area of bonding increases. Accordingly, the solder is made less likely to cause cracks, enough to improve the adhesiveness of between the pads 14 and the solder material 50, and thereby the temperature resistance may be improved.

Figure 11:
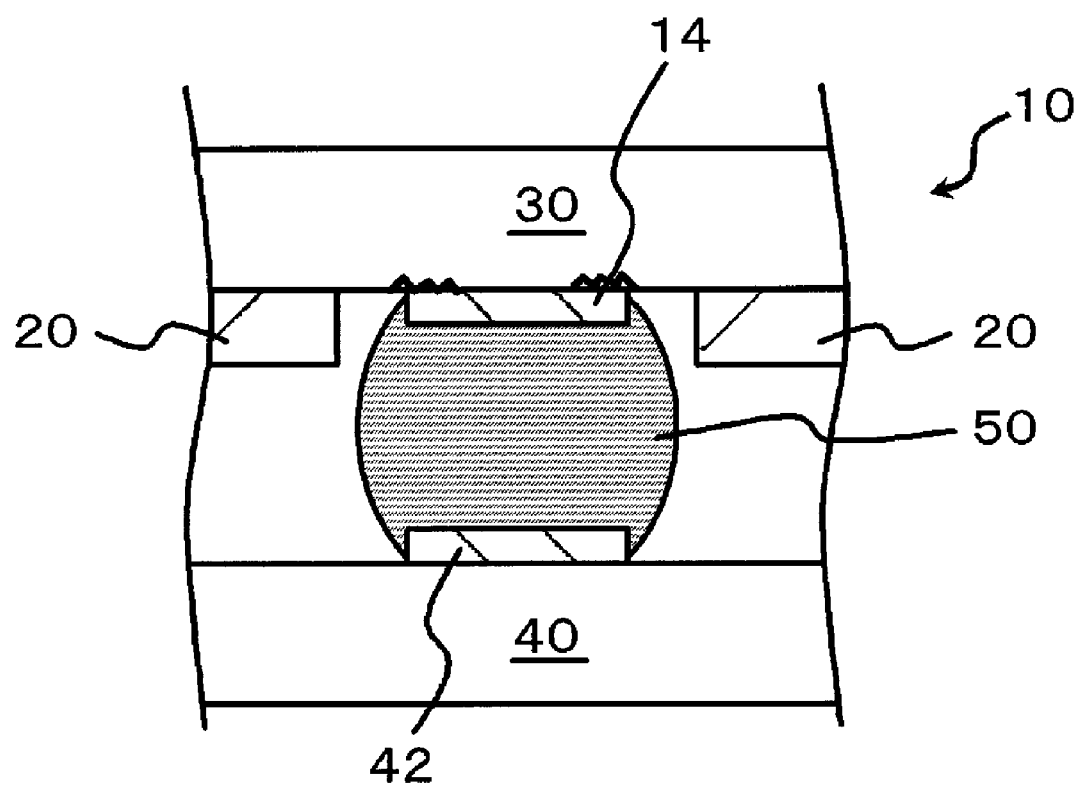

On the other hand, adoption of the NSMD structure, aiming at improving the adhesiveness between the pads and the solder, distinctively concentrates impact-induced stress at the interface between the pads and the base under a large impact typically caused by dropping, as previously illustrated in FIG. 11, enough to cause separation of the pads 14 from the base 30. In contrast, according to the configuration of the substrate 100, the semiconductor device 200, and the semiconductor device chip 250 of this embodiment, the separation between the pads and the base may effectively be avoidable even under a large impact typically caused by dropping. As a consequence, also the flat electrode pads of the LGA package may be improved in the adhesiveness between the pads 14 and the solder material 50, so that separation between the pads and the base may be avoidable even under a strong impact.

The embodiments of the present invention have been described referring to the attached drawings merely for exemplary purposes, while allowing adoption of various configurations other than those described in the above.

For example, although the embodiments in the above dealt with exemplary cases where each of the pads 106 and the pads 144 formed at the corners of the base 130 has a geometry different from that of the other pads 104 and the pads 142. The pads formed at the corners may, however, have a geometry same with that of the other pads. Note that, also in this case, the pads formed at the corners may be formed so that the first peripheral portion thereof more closer to the corner and more distant away from the center of the base is covered by the solder resist layer, and so that the second peripheral portion more closer to the center of the base as compared with said first peripheral portion is exposed in the opening.

In addition, the embodiments in the above dealt with exemplary cases where, among the plurality of pads, only those formed at the corners farthest from the center are formed so that the first peripheral portion thereof more closer to the corner and more distant away from the center of the base is covered by the solder resist layer, and so that the second peripheral portion more closer to the center of the base as compared with said first peripheral portion is exposed in the opening. Alternatively, besides the pads formed at the corners, also the pads formed in the outer circumferential area may be formed so that the first peripheral portion thereof more closer to the corner and more distant away from the center of the base is covered by the solder resist layer, and so that the second peripheral portion more closer to the center of the base as compared with said first peripheral portion is exposed in the opening. In this case as well, the pads formed in the inner area may be configured so as to expose the entire peripheral portion thereof, except a portion brought into contact with the correspondent interconnects, in the openings of the solder resist layer.

The embodiments in the above dealt with exemplary cases where the configuration of the present invention is adopted to both of the surface of the substrate 100 facing to the electronic circuit substrate 210 (external electrode structure), and the surface of the substrate 100 facing to the semiconductor element 220. Alternatively, either one of the surfaces may be configured as described in the above, while leaving the other surface configured to have the general pattern. Further, the configuration of the present invention may be adapted to the flat electrode pads of a BGA (ball grid array) package as well.

It is apparent that the present invention is not limited to the above embodiments, that may be modified and changed without departing from the scope and spirit of the invention.

What is claimed is:

1. A semiconductor device comprising:
   a base with a first surface and a second surface opposite to the first surface;
   a semiconductor element formed over the second surface of the base;
   a plurality of pads formed on the first surface of the base; and
   an insulating film formed on the first surface of the base and the plurality of pads, the insulating film having an opening through which the pads are exposed,
   the base including:
   a first side and an adjacent second side viewed in a direction normal to the first surface;
   a first intersection point between the first side and the second side; and
   a first pad nearest the first intersection point in the plurality of pads,
   the first pad including:
   a first peripheral portion near the first intersection point; and
   a second peripheral portion near a center point of the base,
   the first peripheral portion being covered with the insulating film; and
   the second peripheral portion being exposed from the insulating film.

2. The semiconductor device as set forth in claim 1, further comprising:
   a first interconnect;
   the first interconnect being:
   formed on the first surface of the base;
   extended from the first pad;
   connected to a first contact provided in the base; and
   formed between the first peripheral portion and the second peripheral portion.

3. The semiconductor device as set forth in claim 2, wherein a portion of the first interconnect and the first contact are covered with the insulating film.

4. The semiconductor device as set forth in claim 1, wherein the first pad is farthest from the center point of the base among the plurality of pads.

5. The semiconductor device as set forth in claim 1, wherein the first peripheral portion and the second peripheral portion of the first pad are on a line connecting between the center point of the base and the first intersection point.

6. The semiconductor device as set forth in claim 1, the base being formed with a rectangular geometry,
   the base including:
   a third side adjacent to the first side and opposite to the second side through the center point of the base;
   a fourth side adjacent to the second side and the third side, and opposite to the first side through the center point of the base;
   a second intersection point between the second side and the fourth side;
   a third intersection point between the first side and the third side;
   a fourth intersection point between the third side and fourth side; and
   a second pad nearest from the second intersection point in the plurality of pads,
   the second pad being including:
   a first peripheral portion near from the second intersection point; and
   a second peripheral portion near from the center point of the base,
   the first peripheral portion being covered with the insulating film; and
   the second peripheral portion being exposed from the insulating film,
   the third pad being including:
   a first peripheral portion near the third intersection point; and
   a second peripheral portion near from the center point of the base,
   the first peripheral portion being covered with the insulating film; and
   the second peripheral portion being exposed from the insulating film,
   the fourth pad being including:
   a first peripheral portion near the fourth intersection point; and
   a second peripheral portion near the center point of the base,
   the first peripheral portion being covered with the insulating film; and
   the second peripheral portion being exposed from the insulating film.

7. The semiconductor device as set forth in claim 6, the plurality of pads being including:
   a fifth pad adjacent to the first pad and farther away from the first intersection point than the first pad;
   the fifth pad being including a fifth interconnect, the fifth interconnect being:
   formed on the first surface of the base;
   extended from the fifth pad;
   connecting to a fifth contact provided in the base; and entirely exposed from the insulating film except for a portion connecting to the fifth interconnect.

8. The semiconductor device as set forth in claim 7, the plurality of pads being comprising the first to fifth pads and a plurality of sixth pads,
the plurality of sixth pads each being including a sixth interconnect,
the sixth interconnect being:
formed on the first surface of the base;
connecting one end of the sixth interconnect with each of the sixth pads; and
connecting the other end of the sixth interconnect with a contact connecting to each of the sixth pads,
the plurality of sixth pads being including a peripheral portion, and
the peripheral portion being entirely exposed from the insulating film except a portion connecting to the plurality of sixth interconnects.

9. A device chip comprising:
the semiconductor device as set forth in claim 1; and
an interconnect substrate, the interconnect substrate including an electrode connecting to the semiconductor device through the plurality of pads and a solder.

10. The semiconductor device as set forth in claim 1, further comprising a pad with a geometry different from that of the first pad.

11. The semiconductor device as set forth in claim 1, further comprising a pad, the pad including an opening with a geometry different from that of the first pad.

12. The semiconductor device as set forth in claim 6, further comprising a pad, the pad including an opening with a geometry different from those of the first to fourth pads.

13. The semiconductor device as set forth in claim 6, wherein the openings on the first to fourth pads and the other openings have different geometries from each other.

14. The semiconductor device as set forth in claim 1, the first pad being having a circular geometry with a reinforcing pattern added to an outer circumferential side thereof.

15. The semiconductor device as set forth in claim 14, the reinforcing pattern being having a nearly rectangular geometry with one corner positioned at a corner side of the base being chamfered to give an arch profile.

16. The semiconductor device as set forth in claim 1, the first pad being having a geometry containing a reinforcing pattern formed in a portion of the pad more closer to the corner and more distant away from the corner of the base, and the first peripheral portion is provided to the reinforcing pattern.

* * * * *